US006955948B2

(12) United States Patent
Asahi et al.

(10) Patent No.: US 6,955,948 B2
(45) Date of Patent: Oct. 18, 2005

(54) METHOD OF MANUFACTURING A COMPONENT BUILT-IN MODULE

(75) Inventors: Toshiyuki Asahi, Osaka (JP); Yasuhiro Sugaya, Osaka (JP); Shingo Komatsu, Kadoma (JP); Seiichi Nakatani, Hirakata (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 367 days.

(21) Appl. No.: 10/271,937

(22) Filed: Oct. 15, 2002

(65) Prior Publication Data

US 2003/0062624 A1 Apr. 3, 2003

Related U.S. Application Data

(62) Division of application No. 10/038,212, filed on Jan. 3, 2002, now Pat. No. 6,489,685.

(30) Foreign Application Priority Data

Jan. 19, 2001 (JP) ....................................... 2001-011656

(51) Int. Cl.[7] ................................................ H01L 21/44

(52) U.S. Cl. ....................... 438/125; 438/622; 438/629; 438/637; 438/667; 438/668; 438/672; 438/675; 257/723; 257/750; 257/758; 257/774; 257/775; 257/778; 257/783

(58) Field of Search ................................. 438/125, 622, 438/629, 637, 640, 667–668, 672, 675, 700–701, 713, 978; 257/750, 758, 774, 775, 778, 783, 723

(56) References Cited

U.S. PATENT DOCUMENTS

| | | | | |
|---|---|---|---|---|
| 5,353,195 A | | 10/1994 | Fillion et al. | |
| 5,872,051 A | | 2/1999 | Fallon et al. | |
| 5,874,770 A | | 2/1999 | Saia et al. | |
| 6,038,133 A | | 3/2000 | Nakatani et al. | |
| 6,570,469 B2 | * | 5/2003 | Yamada et al. | 333/193 |
| 6,576,499 B2 | * | 6/2003 | Funaya et al. | 438/125 |
| 6,784,765 B2 | * | 8/2004 | Yamada et al. | 333/193 |
| 2002/0076919 A1 | * | 6/2002 | Peters et al. | 438/637 |
| 2002/0119396 A1 | * | 8/2002 | Jiang et al. | 430/311 |
| 2003/0038373 A1 | * | 2/2003 | Cohn et al. | 257/777 |
| 2003/0075811 A1 | * | 4/2003 | Cohn et al. | 257/777 |

FOREIGN PATENT DOCUMENTS

| | | |
|---|---|---|
| EP | 0 774 888 | 5/1997 |
| EP | 0 920 058 | 6/1999 |
| EP | 1 069 616 | 1/2001 |

(Continued)

*Primary Examiner*—Lynne A. Gurley
(74) *Attorney, Agent, or Firm*—Merchant & Gould P.C.

(57) ABSTRACT

A component built-in module includes an electric insulation layer, first wiring patterns in a plurality of layers that are laminated with the electric insulation layer being interposed therebetween, at least one first inner via electrically connecting the first wiring patterns in different layers with each other, and at least one electronic component that is embedded in the electric insulation layer and is mounted on any one of the first wiring patterns in the plurality of layers, wherein at least one of the first inner vias is present in a range that overlaps a range in which the electronic component is present in a lamination direction in which the first wiring patterns are laminated, and has a height in the lamination direction that is smaller than a height of the electronic component. Since the first inner via has a small height, the via diameter can be decreased. Therefore, it is possible to provide a component built-in module that has high reliability and is suitable for high-density component mounting.

19 Claims, 9 Drawing Sheets

FOREIGN PATENT DOCUMENTS

| | | |
|---|---|---|
| JP | 5-259372 | 10/1993 |
| JP | 6-350211 | 12/1994 |
| JP | 7-154073 | 6/1995 |
| JP | 7-307407 | 11/1995 |
| JP | 9-46046 | 2/1997 |
| JP | 10-284632 | 10/1998 |
| JP | 11-103147 | 4/1999 |
| JP | 11-126978 | 5/1999 |
| JP | 11-163249 | 6/1999 |
| JP | 11-220262 | 8/1999 |
| JP | 2000-4071 | 1/2000 |
| JP | 2000-208662 | 7/2000 |
| JP | 2001-44641 | 2/2001 |
| JP | 2001-60602 | 3/2001 |
| JP | 2001-210776 | 8/2001 |
| JP | 2001-244638 | 9/2001 |

* cited by examiner

METHOD OF MANUFACTURING A COMPONENT BUILT-IN MODULE

This application is a divisional of U.S. application Ser. No. 10/038,212, filed Jan. 3, 2002 now U.S. Pat. No. 6,489,685, which application(s) are incorporated herein by reference.

BACKGROUND OF THE INVENTION

1. Field of the Invention

The present invention relates to a component built-in module in which an electronic component such as a semiconductor and/or a circuit component is provided inside an electric insulation layer, and to a method for manufacturing the same.

2. Related Background Art

Recently, following the tendency of electronic devices toward high performance and compact size, it is increasingly demanded to achieve high density and improved function of circuit components. It also is demanded to provide a circuit-component-mounted module suitable for high density and improved performance. To mount circuit components at a higher density, wiring patterns are complicated increasingly, and hence, there is a tendency of wiring boards toward multi-lamination.

In the case of conventional glass-epoxy substrates, multi-lamination is achieved with a through hole structure that is obtained by drilling. This structure has high reliability, but wiring patterns provided thereon are limited since wiring patterns in different layers are connected using through holes. Furthermore, a semiconductor or a circuit component cannot be mounted at an area on a surface of the wiring board where the through hole is provided, and therefore, it is not suitable for high-density component-mounting.

Therefore, as a method for achieving high densification of circuitry, a multi-layer wiring board utilizing electric connection by inner vias is used also. The inner via connection allows the wiring patterns between large scale integrated circuits (LSIs) and components to be connected over the shortest distances, and also provides only necessary connections between wiring pattern layers, thereby facilitating the circuit component mounting. Furthermore, by incorporating circuit components in a wiring board, the component mounting efficiency is improved further.

However, the incorporation of circuit components and the connection of the same through inner vias may have a problem in reliability. The reliability of the inner via connection is influenced significantly by the ratio of a height of an inner via to a diameter thereof (i.e., aspect ratio=height/diameter). In the case where a circuit component is incorporated in a wiring board, an electric insulation layer having a height greater than a height of the circuit component is required, thereby necessarily causing an inner via to have a greater height. Therefore, to improve the connection reliability, it is necessary to increase the diameter of an inner via. However, an increase in the diameter leads to a decrease in the mounting density.

SUMMARY OF THE INVENTION

Therefore, it is an object of the present invention to provide a component built-in module that has high reliability and is suitable for high-density component-mounting, and a method for manufacturing the same.

A first component built-in module of the present invention includes: an electric insulation layer; first wiring patterns in a plurality of layers that are laminated with the electric insulation layer being interposed therebetween; at least one first inner via electrically connecting the first wiring patterns in different layers with each other; and at least one electronic component that is embedded in the electric insulation layer and is mounted on any one of the first wiring patterns in the plurality of layers. Herein, at least one of the first inner vias is present in a range that overlaps a range in which the electronic component is present in a lamination direction in which the first wiring patterns are laminated, and has a height in the lamination direction that is smaller than a height of the electronic component.

Here, in the present invention, "height of an electronic component" means a distance from an upper surface of a wiring pattern on which the electronic component is mounted to an upper surface of the electronic component. More preferably, it means a thickness of the electronic component itself. Furthermore, the term "overlap" herein means that the two concerned ranges overlap each other at least partly, and the ranges do not necessarily coincide with each other completely.

This configuration makes it possible to suppress a height of the first inner via provided substantially opposite to the electronic component in a direction perpendicular to the lamination direction of the first wiring patterns. As a result, even with a decreased diameter of the via, the degradation of reliability resulting from an increase in the aspect ratio is prevented. Therefore, it is possible to provide a component built-in module that has high reliability and is suitable for high-density component-mounting.

The first component built-in module preferably further includes a wiring board including second wiring patterns in at least two layers, and a through hole and/or a second inner via that electrically connects the second wiring patterns in different layers with each other. Here, the wiring board is embedded inside the electric insulation layer, and any one of the first wiring patterns in the plurality of layers and the second wiring pattern are connected electrically through an inner via.

This configuration makes it possible to provide a component built-in module suitable for high-density component-mounting, taking advantage of the high reliability of the wiring board. Further, since a generally used wiring board can be used, this leads to a decrease in production cost.

Next, a second component built-in module of the present invention includes: an electric insulation layer; first wiring patterns in a plurality of layers that are laminated with the electric insulation layer being interposed therebetween; at least one first inner via electrically connecting the first wiring patterns in different layers with each other; a wiring board including second wiring patterns in at least two layers, and a through hole and/or a second inner via that electrically connects the second wiring patterns in different layers with each other; and at least one electronic component that is embedded in the electric insulation layer and is mounted on any one of the second wiring patterns. Here, at least one of the first inner vias is present in a range that overlaps a range in which the electronic component is present in a lamination direction in which the first wiring patterns are laminated, and has a height in the lamination direction that is smaller than a height of the electronic component.

In a component built-in module that utilizes an existing element having an electronic component mounted on a wiring board, and has an electric insulation layer laminated on the electronic component-mounted surface, it is possible to decrease a height of the first inner via provided substantially opposite to the electronic component in a direction perpendicular to the lamination direction of the first wiring pattern. As a result, even with a decreased diameter of the via, the degradation of reliability resulting from an increase in the aspect ratio is prevented. Therefore, it is possible to provide a component built-in module that has high reliability and is suitable for high-density component-mounting.

Each of the first and second component built-in modules preferably further includes at least one electronic component that is mounted on any one of the first wiring patterns in the plurality of layers, and is not embedded in the electric insulation layer. This provides a component built-in module that has high reliability and is suitable for mounting components at a further higher density.

Furthermore, in each of the first and second component built-in modules, the electric insulation layer preferably is made of a mixture of a filler and an insulating resin. By selecting a type of a filler, it is possible to control a heat conductivity, a coefficient of linear expansion, a dielectric constant, etc. of the electric insulation layer.

In this case, the filler preferably contains at least one selected from alumina, magnesia, boron nitride, aluminum nitride, silicon nitride, tetrafluoroethylene, and silica. This makes it possible to provide an electric insulation layer that is excellent in heat dissipation. In the case where alumina is used as a filler, an advantage of low cost is achieved. The use of magnesia as a filler provides an increase in the coefficient of linear expansion of the electric insulation layer. In the case where boron nitride, aluminum nitride, or silicon nitride is used as a filler, it is possible to decrease the coefficient of linear expansion. The use of tetrafluoroethylene or silica as a filler provides an electric insulation layer having a low dielectric constant.

Furthermore, the insulating resin preferably contains at least one selected from an epoxy resin, a phenol resin, a fluorocarbon resin, a cyanate resin, a polytetrafluoroethylene (PTFE) resin, a poly(phenylene oxide) (PPO) resin, and a polyphenylether (PPE) resin. By selecting an appropriate insulating resin material, it is possible to improve a heat resistance, an electric insulation, and high-frequency characteristics.

In each of the first and second component built-in modules, the first wiring patterns preferably are made of at least one selected from a metal foil, a lead frame, and a conductive resin composition. This allows a fine wiring pattern having a low electric resistance to be formed.

In each of the first and second component built-in modules, the electronic component preferably is a semiconductor bare chip. This allows semiconductor elements to be mounted at a higher density, and since the semiconductor is thinner, this allows the electric insulation layer to have a smaller thickness.

In this case, the semiconductor bare chip preferably is mounted by flip chip bonding. This allows the semiconductor elements to be mounted at a high density.

Furthermore, in each of the first and second component built-in modules, the first inner via preferably is made of a via paste containing a conductive powder and a thermosetting resin. This allows the electric insulation layer and the first inner via to be cured simultaneously, thereby decreasing the number of manufacturing steps.

Furthermore, the wiring board preferably is composed of a ceramic substrate, a glass-epoxy substrate, or a multi-layer substrate having an inner via connection. This configuration allows a component built-in module to be formed using a generally used wiring board, thereby reducing the production cost.

Furthermore, in each of the first and second component built-in modules, the electric insulation layer in contact with the electronic component and the electric insulation layer in contact with the first inner via preferably are provided integrally. The phrase "provided integrally" herein indicates that the two electric insulation layers have a common composition and are continuous seamlessly. This causes these electric insulation layers to be provided continuously without a boundary, thereby improving the reliability.

Furthermore, in each of the first and second component built-in modules, a plurality of the electronic components preferably are disposed opposite in the lamination direction in which the first wiring patterns are laminated. This allows electric components to be mounted at a higher density.

Furthermore, in each of the first and second component built-in modules, the first wiring patterns preferably include a land pattern electrically connected with the first inner via. This increases an area capable of incorporating electronic components, thereby allowing the same to be mounted at a high density.

A first method for manufacturing a component built-in module according to the present invention includes the steps of: forming a first inner via in an electric insulation layer; mounting an electronic component on a first wiring pattern; and laminating the electric insulation layer and another wiring pattern different from said first wiring pattern in this order on a surface of the first wiring pattern on which the electronic component is mounted so that said first wiring pattern and the another wiring pattern, which are provided opposite each other with the electric insulation layer being interposed therebetween, are electrically connected through the first inner via. Here, the electric insulation layer before being laminated has a thickness smaller than a height of the electronic component in a direction of the lamination.

This allows the first component built-in module of the present invention to be manufactured readily.

In the first method, it is preferable that the another wiring pattern is provided on a surface of another electric insulation layer different from said electric insulation layer, and that the another wiring pattern is connected with an inner via formed in the another electric insulation layer. This facilitates the handling of the another wiring pattern, and allows wiring patterns to be laminated in multiple layers through a decreased number of manufacturing steps.

Furthermore, in the first method the another wiring pattern preferably is carried on a carrier, and the method further includes the step of removing the carrier that is carried out after the laminating step. This facilitates the handling of the another wiring pattern.

Furthermore, in the first method, the another wiring pattern preferably is a second wiring pattern exposed on a surface of a wiring board that includes second wiring patterns in at least two layers, including said second wiring pattern, and a through hole and/or a second inner via that electrically connects the second wiring patterns in different layers with each other. This allows a generally used wiring board having high reliability to be incorporated along with the electronic components.

Next, a second method for manufacturing a component built-in module according to the present invention includes the steps of: forming a first inner via in an electric insulation layer; preparing a wiring board including second wiring patterns in at least two layers, and a through hole and/or a second inner via that electrically connects the second wiring patterns in different layers with each other; mounting an electronic component on the second wiring pattern that is exposed on a surface of the wiring board; and laminating the electric insulation layer and a first wiring pattern in this order on the second wiring pattern on which the electronic component is mounted, so that the second wiring pattern and the first wiring pattern, which are provided opposite with the electric insulation layer being interposed therebetween, are electrically connected through the first inner via. Here, the electric insulation layer before being laminated has a thickness smaller than a height of the electronic component in a direction of the lamination.

This allows the second component built-in module of the present invention to be manufactured readily.

In the second method, it is preferable that the first wiring pattern is provided on a surface of another electric insulation layer different from said electric insulation layer, and that the first wiring pattern is connected with an inner via formed in the another electric insulation layer. This facilitates the handling of the first wiring pattern, and allows wiring patterns to be laminated in multiple layers through a decreased number of manufacturing steps.

Furthermore, in the second method, the first wiring pattern preferably is carried on a carrier, and the method further includes the step of removing the carrier that is carried out after the laminating step. This facilitates the handling of the first wiring pattern.

Furthermore, in each of the first and second methods, the electric insulation layer before being laminated has a hole for accepting the electronic component. This suppresses the displacement of the first inner via when the electronic component is embedded.

In each of the first and second methods, at least a part of the electronic component preferably is embedded in the electric insulation layer upon the electric connection. This allows a component built-in module of the present invention to be manufactured readily.

Furthermore, in each of the first and second methods, the electric insulation layer is cured upon making the electric connection. This allows a component built-in module of the present invention to be manufactured through a decreased number of manufacturing steps.

Furthermore, in each of the first and second methods, it is preferable that at least a part of the electronic component is embedded in the electric insulation layer and the electric insulation layer is cured upon the electric connection. This allows a component built-in module of the present invention to be manufactured through a decreased number of manufacturing steps.

Furthermore, in each of the first and second methods, the electric insulation layer before being laminated preferably is in a non-cured state. This allows an electric insulation layer in contact with the electronic component and an electric insulation layer in contact with the first inner via to be provided integrally, thereby producing a component built-in module of the present invention with high reliability.

Furthermore, in each of the first and second methods, it is preferable that the another electric insulation layer has a wiring pattern on the other surface thereof, and the wiring pattern on the other surface is connected with the inner via of the another electric insulation layer. This causes the inner via formed in the another electric insulation layer to be not exposed, thereby facilitating the handling of the another electric insulation layer, and improving the connection reliability of the inner via.

DETAILED DESCRIPTION OF THE INVENTION

First Embodiment

Figure 1:
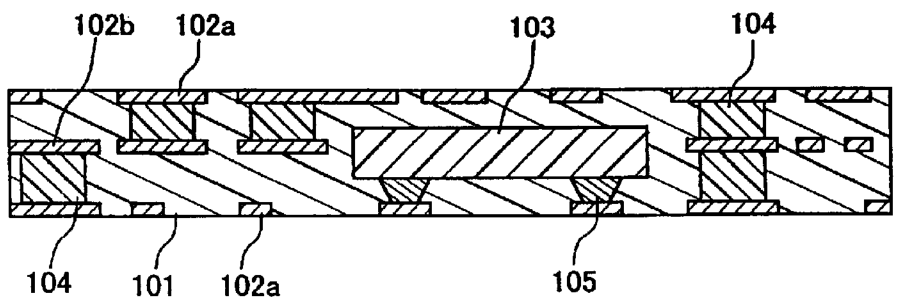
FIG. 1 is a cross-sectional view illustrating a component built-in module according to a first embodiment of the present invention.

FIG. 1 is a cross-sectional view illustrating a component built-in module according to a first embodiment. In FIG. 1, the component built-in module includes an electric insulation layer 101, wiring patterns first wiring pattern) 102*a* and 102*b*, a semiconductor 103 as an electronic component, and inner vias (first inner vias) 104 made of a via paste.

The electric insulation layer 101 may be made of, for instance, an insulating resin, or a mixture of a filler and an insulating resin. In the case where a mixture of a filler and an insulating resin is used for forming the electric insulation layer 101, the coefficient of linear expansion, the heat conductivity, the dielectric constant, etc. of the electric insulation layer 101 can be controlled readily by appropriately selecting the filler and the insulating resin.

For instance, alumina, magnesia, boron nitride, aluminum nitride, silicon nitride, tetrafluoroethylene (for instance, "Teflon" (trademark of Du Pont)), or silica may be used as a filler. By utilizing alumina, boron nitride, or aluminum nitride, a substrate having a higher heat conductivity than that of the conventional glass-epoxy substrate can be produced, which dissipates heat generated by the semiconductor 103 efficiently. Alumina has an advantage of low cost. In the case where silica is used, the coefficient of linear expansion of the electric insulation layer further approximates the coefficient of linear expansion of the silicon semiconductor, thereby making it possible to prevent cracks, etc., from occurring due to a temperature change. Therefore, silica is preferable in the case of a semiconductor of a flip-chip type that is mounted directly. Furthermore, in this case, since an electric insulation layer with a low dielectric constant is obtained and it has a smaller specific gravity as well, it is preferably applied for forming a high-frequency-use substrate for use in a cellular phone, etc. The use of silicon nitride or tetrafluoroethylene also provides an electric insulation layer having a low dielectric constant.

Furthermore, the use of boron nitride provides a decrease in the coefficient of linear expansion. The use of magnesia provides an increase in the coefficient of linear expansion of the electric insulation layer.

As the insulating resin, a thermosetting resin or a photocurable resin can be used. The use of an epoxy resin, a phenol resin, or a cyanate resin having a high heat resistance allows the heat resistance of the electric insulation layer to increase. Further, the use of a resin containing a fluorocarbon resin, a PTFE resin, a PPO resin, or a PPE resin that has a low dielectric dissipation factor, or a resin obtained by denaturing any one of these resins improves high-frequency characteristics of the electric insulation layer. Furthermore, the insulating resin may contain a disperser, a coloring agent, a coupling agent, or a releasing agent. The disperser causes the filler in the insulating resin to be dispersed uniformly. The coloring agent improves the heat dissipation of the component built-in module. The coupling agent allows the strength of adhesion between the insulating resin and the filler to increase, thereby increasing the insulation of the electric insulation layer. The releasing agent improves the releasability of the mixture from a die, thereby improving the productivity.

The wiring patterns 102*a* and 102*b* are made of a material having an electric conductivity, and a metal foil, a conductive resin composition, a lead frame obtained by processing a metal plate, etc. may be used, for instance. The use of a metal foil or a lead frame allows fine wiring patterns to be formed by etching or the like, thereby facilitating the formation of the same. Further, in the case where a metal foil is used, it is possible to form a wiring pattern by transferring by means of a carrier. A copper foil is preferable particularly, since it has low cost and has a high electric conductivity. In the case where a wiring pattern is formed on a carrier, the wiring pattern can be treated with ease. In the case where a conductive resin composition is used, it is possible to form a wiring pattern by screen printing. In the case where a conductive resin composition is used, by using a metal powder of gold, silver, copper, nickel, etc., or a carbon powder, a wiring pattern with a low electric resistance can be obtained. In the case where the conductive resin composition contains as a resin, at least one thermosetting resin selected from epoxy resins, phenol resins, and cyanate resins, the heat resistance can be improved. The use of the lead frame allows a metal having a low electric resistance to be formed thick. Furthermore, this allows easier manufacturing techniques such as micro-machining by etching, or stamping to be used. In the case where lead frames are used, a plurality of wiring patterns may be connected at peripheries of the lead frames, so that the wiring patterns are handled as an integrated pattern. Furthermore, by plating surfaces of the wiring patterns 102*a* and 102*b*, their corrosion resistance and electric conductivities can be improved. Furthermore, in the case where contact surfaces of the wiring patterns 102*a* and 102*b* with the electric insulation layer 101 are roughened, the adhesivity thereof with the electric insulation layer 101 can be improved. In the following description, among wiring patterns in a plurality of layers (three layers in FIG. 1), a wiring pattern exposed to the outside of the component built-in module is referred to with a subscript "a", hence, as "wiring pattern 102*a*", while a wiring pattern embedded in the component built-in module is referred to with a subscript "b", hence, as "wiring pattern 102*b*" or "inner wiring pattern 102*b*". This applies to the descriptions of second to fourth and seventh to tenth embodiments.

As the semiconductor 103, a semiconductor element such as a transistor, an integrated circuit (IC), or an LSI can be used. The semiconductor element may be a semiconductor bare chip. The semiconductor element may be embedded in a manner such that the semiconductor element, or at least a part of the semiconductor element and connecting portions of the same with the wiring patterns 102*a* and 102*b*, is sealed with a sealing resin. For connecting the wiring patterns 102*a* and 102*b* with the semiconductor 103, a conductive adhesive, an anisotropic conductive film (ACF), etc. is used in the case of flip chip bonding. The connection may be achieved by forming a bump 105. Furthermore, since the electric insulation layer 101 protects the semiconductor 103 from the ambient atmosphere, it is possible to prevent the reliability from degrading due to moisture. Furthermore, in the case where a mixture of a filler and an insulating resin is used as a material for the electric insulation layer 101, the sintering process is unnecessary, unlike a ceramic substrate, thereby making it easy to embed the semiconductor 103 therein.

The via paste for forming the inner vias 104 may be a mixture of a conductive powder and a resin that has a function of connecting the wiring patterns 102*a* and 102*b* in different layers with each other. For instance, a mixture of a conductive powder such as a metal powder or a carbon powder, and a thermosetting or photocurable resin may be used. Examples of metal powders include gold, silver, copper, and nickel. Gold, silver, copper, and nickel are preferable since they have high conductivities. Copper particularly is preferable since it has a high conductivity and migration of the same hardly occurs. A metal powder obtained by coating copper with silver also satisfies both the requirements of high conductivity and minimum migration. Examples of thermosetting resins include epoxy resins, phenol resins, and cyanate resins. Epoxy resins particularly are preferable since they have high heat resistance. Further, photocurable resins can be used.

In the present embodiment, the height of the inner vias 104 in the lamination direction of the wiring patterns 102*a* and 102*b* (the vertical direction as viewed in FIG. 1) is smaller than a distance from a surface of the wiring pattern 102*a* on which the semiconductor 103 is mounted to an upper surface of the semiconductor 103 (more preferably, the thickness of the semiconductor 103). It is preferable in particular that the semiconductor 103 and the inner via 104 that is present in a range overlapping the range in which the semiconductor 103 is present (i.e., the inner via 104 that is provided to face the semiconductor 103 in the horizontal direction as viewed in FIG. 1) in the foregoing direction satisfy the foregoing requirement of relationship as to height. The wiring patterns 102*a* that face each other in the lamination direction are connected not directly by means of one inner via, but by means of a plurality of inner vias 104 with the inner wiring patterns 102*b* being interposed therebetween, whereby the foregoing requirement of relationship as to height can be satisfied. Thus, by electrically connecting the inner wiring patterns 102*b* and the wiring patterns 102*a* with the inner vias 104, a ratio of a height of the inner vias 104 to a diameter of the same can be decreased. In the present embodiment, since only one layer of the inner wiring patterns 102*b* is provided, the foregoing ratio is approximately ½ of that in the case where the inner wiring patterns 102*b* are not provided. Consequently, connection with high reliability is ensured, thereby making it possible to provide a component built-in module suitable for incorporating a semiconductor.

It should be noted that the present embodiment is described by taking as an example the case where the wiring patterns 102*a* on both surfaces of the component built-in module are not embedded inside the electric insulation layer; however, the wiring patterns on at least one surface of the layer may not necessarily be exposed, but may be covered with the electric insulation layer. Besides, the present embodiment is described by taking as an example the case where the inner wiring patterns 102*b* are in only one layer, but the number of layers is not limited. In the case where a plurality of layers of inner wiring patterns 102*b* exist, the inner wiring patterns 102*b* in different layers also are connected with the inner vias 104. The incorporated electronic component is not limited to the semiconductor 103, which is a so-called active component, as in the present embodiment, but it may be another circuit component for instance, a chip component like an LCR (inductance, capacitance, resistance), a surface acoustic wave (SAW) filter, or a balun), which is a so-called passive component.

Second Embodiment

A second embodiment is an example of a method for manufacturing a component built-in module shown in FIG. 1. Materials used for forming the component built-in module are the same as those mentioned in the description of the first embodiment. FIGS. 2A to 2G are cross-sectional views illustrating the process for manufacturing a component built-in module stepwise according to the second embodiment.

Figures 2A, 2B, 2C, 2D, 2E, 2F, 2G:
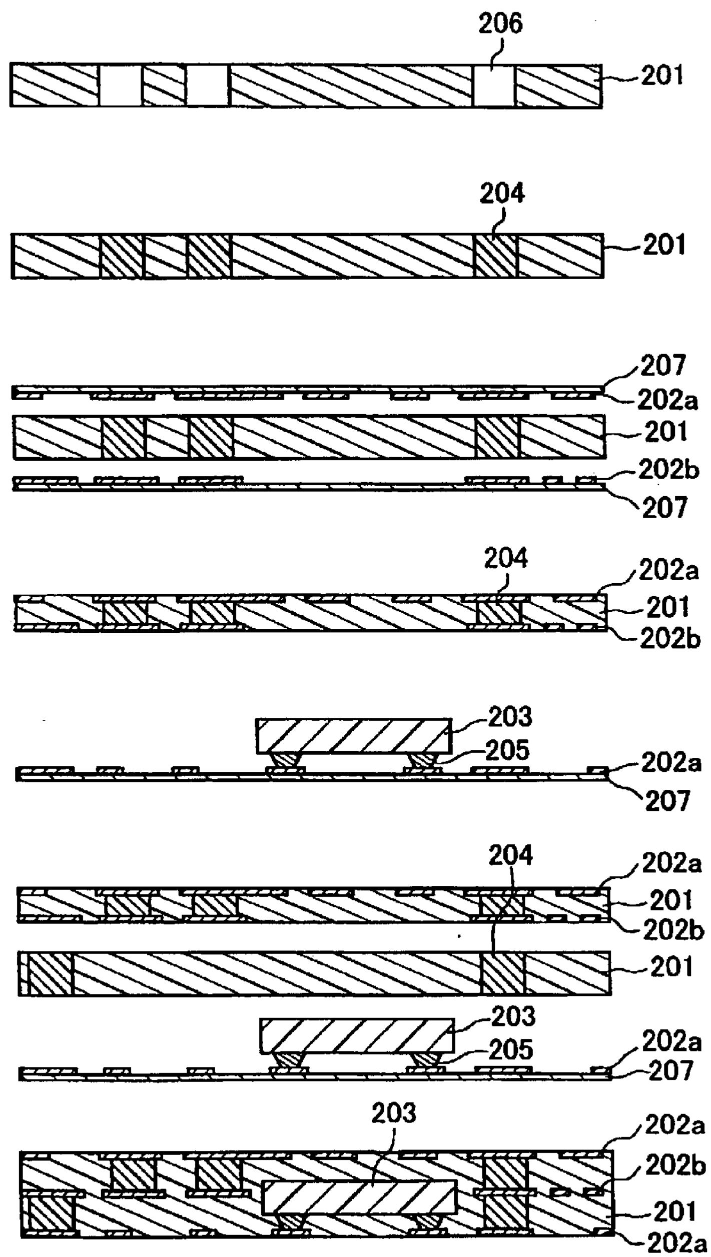
FIGS. 2A to 2G are cross-sectional views illustrating a process for manufacturing a component built-in module stepwise according to a second embodiment.

First of all, an electric insulation layer 201 is formed as shown in FIG. 2A. An example of a method forming the electric insulation layer 201 is as described below. The component built-in module is in a board form, and an insulating resin, a mixture of a filler and an insulating resin, etc. may be used for forming the electric insulation layer 201. In the latter case, a filler and an insulating resin are mixed and stirred, so that a paste-like insulating resin mixture is prepared. A solvent may be added to the insulating resin mixture, so as to control the viscosity. By forming the insulating resin mixture in a sheet form, the electric insulation layer 201 is produced. To form the mixture in a sheet form, a technique of forming a layer of the insulating resin mixture using a doctor blade or the like may be used. The electric insulation layer 201 may be heated to a temperature not higher than the curing temperature and dried, so that the viscosity thereof can be decreased. Since this heat treatment causes the viscosity of the electric insulation layer in a plate form to be lost, the release of the same from a film is facilitated. Besides, by making the same in a non-cured state (B-stage), the handling of the same is facilitated. Next, vias (via holes) 206 are formed in the plate-like electric insulation layer. The vias 206 formed in the electric insulating layer 201 may be formed by laser processing, drilling, punching, etc. The laser processing is preferable since it allows vias to be formed at a fine pitch, and it does not produce shavings. In the case of laser processing, a carbon gas laser, a YAG laser, an excimer laser, etc. can be used. Furthermore, in the case of drilling or punching, vias can be formed with general-purpose existing equipment.

Next, the vias 206 are filled with a via paste 204, as shown in FIG. 2B. To fill the via paste 204, a technique such as printing or injecting can be used. In the case of printing, particularly, wiring patterns can be formed simultaneously. With the via paste 204, the wiring patterns in a plurality of layers can be connected.

Next, as shown in FIG. 2C, wiring patterns 202*a* and 202*b* are formed on carriers 207. The wiring patterns 202*a* and 202*b* are formed by etching, printing, etc. In the case where etching is used, particularly, a technique for forming fine wiring patterns, such as photolithography, may be used. Examples of materials used for forming the carriers 207 include metal foils such as a copper foil and an aluminum foil, in addition to resin films such as films made of polyethylene terephthalate (PET), polyphenylene sulfide (PPS), etc. The use of the carriers 207 facilitates the handling of the wiring patterns 202*a* and 202*b*. Furthermore, releasing layers may be provided between the carriers 207 and the wiring patterns 202*a* and 202*b,* or alternatively, a treatment for providing releasability may be applied to surfaces of the carriers 207, so that the wiring patterns 202*a* and 202*b* can be separated therefrom readily. The wiring patterns 202*a* and 202*b* thus formed are aligned with the electric insulation layer 201, and laminated thereon. By pressing the same, the wiring patterns 202*a* and 202*b* can be transferred onto the electric insulation layer 201.

As shown in FIG. 2D, by separating the carriers 207 after the pressing, the wiring patterns 202*a* and 202*b* are transferred onto both of the surfaces of the electric insulation layer 201, respectively, and are left thereon. In the case where a thermosetting resin is used as the insulating resin, this process is carried out at a temperature not higher than the curing temperature of the thermosetting resin in the electric insulation layer 201, or in a period of time not longer than a period in which the thermosetting resin is cured. By doing so, the wiring patterns 202*a* and 202*b* can be formed in the electric insulation layer 201 in a non-cured state. By forming the wiring patterns 202*b,* a ratio of a height of the via paste 204 to a diameter thereof can be decreased, thereby achieving the improvement of reliability and the reduction of the diameter of the via.

In parallel with the foregoing process, as shown in FIG. 2E, another member is formed by providing wiring patterns 202*a* on a carrier 207. Then, on the wiring patterns 202*a*, a semiconductor 203 is mounted. As a mounting technique, a soldering technique of printing a cream-type solder on the wiring patterns 202*a* and heating is used. Alternatively, a method utilizing ACF, a conductive adhesive (for instance, an adhesive obtained by kneading gold, silver, a copper, silver-palladium alloy, etc. with a thermosetting resin) in place of the cream-type solder may be used. Furthermore, alternatively, a bump 205 formed by gold wire bonding, or a bump formed by soldering, may be formed on the semiconductor 203 side, and the semiconductor 203 may be mounted by melting the gold or the solder by applying a heat treatment. Furthermore, alternatively, the bump 205 and the conductive adhesive may be used in combination. It should be noted that a sealing resin may be injected between the semiconductor 203 and the wiring pattern 202*a*. By injecting a sealing resin, it is possible to prevent a gap from being formed between the semiconductor 203 and the wiring patterns 202*a* when the semiconductor 203 is embedded in the electric insulation layer 201 in a later step. An underfill resin used for ordinary flip chip bonding can be used as the sealing resin.

Subsequently, as shown in FIG. 2F, the electric insulation layer 201 shown in FIG. 2D on which the wiring patterns 202*a* and 202*b* are provided, an electric insulation layer 201 as shown in FIG. 2B, and the carrier 207 provided with the wiring patterns 202*a* on which the semiconductor 203 is mounted as shown in FIG. 2E are aligned and laminated.

By pressing and heating the same, the wiring patterns 202*a* and 202*b* and the semiconductor 203 are embedded in the electric insulation layer 201, as shown in FIG. 2G. In the case where a thermosetting resin is used as an insulating resin, the thermosetting resin in the electric insulation layer 201 is cured by heating after pressing, whereby the electric insulation layer 201 in which the semiconductor 203 is embedded can be formed in a plate form. The heat treatment is carried out at a temperature not lower than the temperature at which the thermosetting resin is cured. The foregoing process provides firm mechanical bonding of the wiring patterns 202*a* and 202*b*, the semiconductor 203, and the electric insulation layer 201. It should be noted that the mechanical strength of the component built-in module is increased by heating the same while being subjected to a pressure of 100 g/mm$^2$ to 2 kg/mm$^2$ when the thermosetting resin is cured by heat application. By removing the carrier 207 after curing the electric insulation layer 201, a component built-in module described as the first embodiment, in which the wiring patterns 202*b* and the semiconductor 203 are embedded in the electric insulation layers 201, is obtained.

In FIG. 2F, the thickness of the lower electric insulation layer 201 among the two electric insulation layers 201 is smaller than a distance from a surface of the wiring pattern 202*a* on which the semiconductor 203 is mounted to an upper surface of the semiconductor 203 (more preferably, the thickness of the semiconductor 203). This configuration allows the aspect ratio of the via paste 204 to decrease.

It should be noted that the present embodiment is described by taking as an example a case where the wiring patterns 202*a* and 202*b* are formed by transferring, but the method for forming the wiring patterns is not limited to this.

Third Embodiment

A third embodiment is an example of a method for producing a component built-in module. FIGS. 3A to 3G are cross-sectional views illustrating the process for manufacturing a component built-in module stepwise according to the third embodiment. The members shown in the drawing that are referred to with the same names as those in the second embodiment have the same structures, are produced by the same methods, and have the same functions, as those in the second embodiment unless otherwise specified.

Figure 3A:
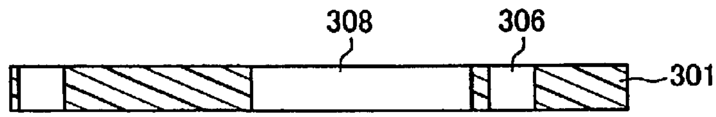
FIGS. 3A to 3G are cross-sectional views illustrating a process for manufacturing a component built-in module stepwise according to a third embodiment.

As shown in FIG. 3A, in an electric insulation layer 301 that is like that shown in FIG. 2A, a hole 308 for incorporating a semiconductor is formed beforehand, in addition to vias 306. By forming the hole 308, it is possible to prevent the vias 306 from being displaced when a semiconductor 303 is embedded in the electric insulation layer 301.

Figure 3B:
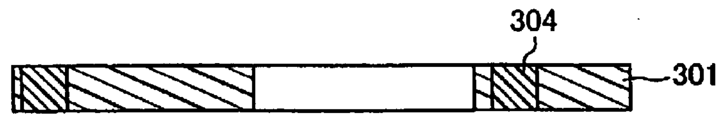

Next, as shown in FIG. 3B, a via paste 304 is filled in the vias 306.

Figure 3C:
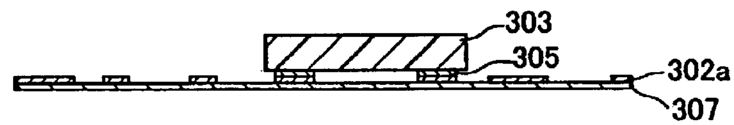

In parallel with the steps shown in FIGS. 3A and 3B, wiring patterns 302*a* are formed on a carrier 307, and the semiconductor 303 is mounted on the wiring patterns 302*a*, as shown in FIG. 3C. As the mounting method, a mounting technique by means of solder, ACF, or a non-conductive particle film (NCF) may be used, or alternatively, a technique utilizing a conductive adhesive 305 may be used. Examples of the conductive adhesive 305 include, for instance, adhesives obtained by kneading gold, silver, a copper, silver-palladium alloy, etc. with a thermosetting resin. Furthermore, the adhesivity may be improved by subjecting the wiring patterns 302*a* and the semiconductor 303 to chelation. It should be noted that a sealing resin may be injected between the semiconductor 303 and the wiring patterns 302*a*. By injecting a sealing resin, it is possible to prevent a gap from being formed between the semiconductor 303 and the wiring pattern 302*a* when the semiconductor 303 is embedded in the electric insulation layer 301 in a later step. An underfill resin used for ordinary flip chip bonding can be used as the sealing resin. The conductive adhesive 305 can be cured by heating, but in this step, it may remain in the non-cured state.

Figure 3D:
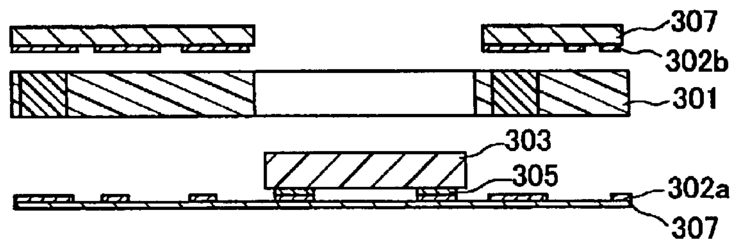

Subsequently, as shown in FIG. 3D, a carrier 307 that has been produced separately so as to be provided with wiring patterns 302*b* and have an opening at a position corresponding to the semiconductor 303, the electric insulation layer 301 shown in FIG. 3B, and the carrier 307 provided with the wiring patterns 302*a* on which the semiconductor 303 is mounted as shown in FIG. 3C are aligned and laminated. Here, the thickness of the electric insulation layer 301 is smaller than a distance from the surface of the wiring pattern 302*a* on which the semiconductor 303 is mounted to an upper surface of the semiconductor 303 (more preferably, the thickness of the semiconductor 303).

After laminating, a pressure is applied so that the wiring patterns 302*a* and 302*b* and the semiconductor 303 are embedded in the electric insulation layer 301. Such embedding is achieved possibly even in the case where the electric insulation layer 301 has a thickness smaller than a height of the semiconductor 303, since the carrier 307 provided with the wiring patterns 302*b* has an opening and a desired thickness. In this step, the electric insulation layer 301 may be cured. In the case where a thermosetting resin is used as the insulating resin, the heat application after pressing causes the thermosetting resin in the electric insulation layer 301 to be cured, thereby providing the electric insulation layer 301 in a plate form in which the semiconductor 303 and the via paste 304 are embedded. The heat treatment is carried out at a temperature not lower than the temperature at which the thermosetting resin is cured. The foregoing process provides firm mechanical bonding of the wiring patterns 302*a* and 302*b*, the semiconductor 303, the via paste 304, and the electric insulation layer 301. It should be noted that the mechanical strength of the component built-in module is increased by heating the same while subjected to a pressure of 100 g/mm$^2$ to 2 kg/mm$^2$ when the thermosetting resin is cured by heat application. The process of curing the electric insulation layer 301 also causes the conductive adhesive 305 to be cured simultaneously. The simultaneous curing provides a decrease in the number of the processing steps, and a decrease in the heat quantity applied to the semiconductor 303 and the like, thereby preventing the characteristics of the semiconductor 303 from degrading. Subsequently, the carrier 307 on the wiring pattern 302*b* side is separated and removed.

Figure 3E:
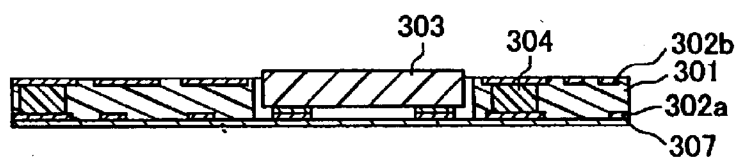
Figure 3F:
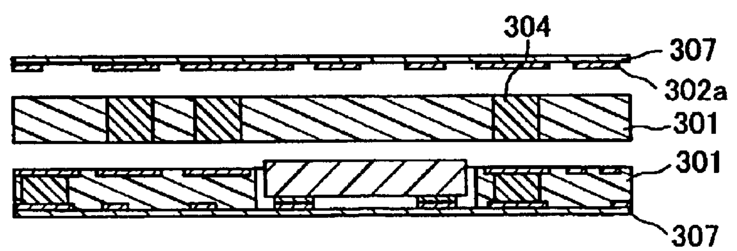
Figure 3G:
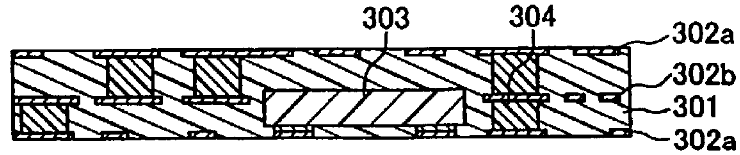

Subsequently, as shown in FIG. 3F, the electric insulation layer 301 shown in FIG. 3E, another electric insulation layer 301 identical to that shown in FIG. 2B, and the carrier 307 provided with the wiring patterns 302*a* are aligned and laminated.

After laminating, the electric insulation layer 301 is cured, as in the step shown in FIG. 3E. Thereafter, the carriers 307 on both of the surfaces are removed, whereby a component built-in module is obtained in which the wiring patterns 302*a* and 302*b*, the semiconductor 303, and the via paste 304 are embedded in the electric insulation layers 301.

Fourth Embodiment

Figure 4:
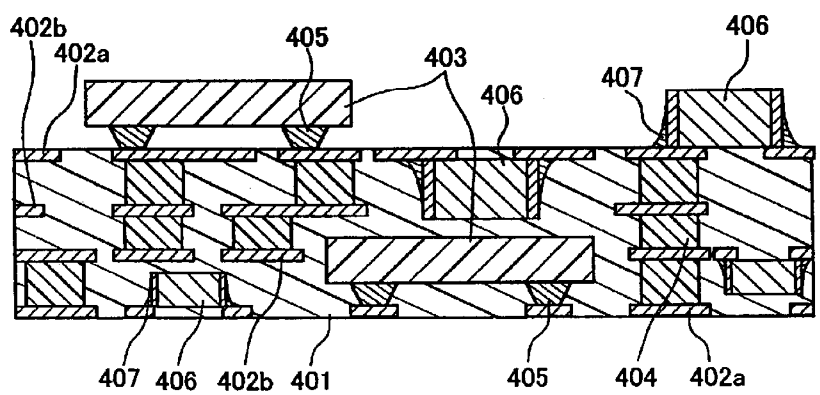
FIG. 4 is a cross-sectional view illustrating a component built-in module according to a fourth embodiment of the present invention.

A fourth embodiment is another example of a component built-in module. FIG. 4 is a cross-sectional view illustrating a component built-in module according the present embodiment. The members shown in the drawing that are referred to with the same names as those in the first embodiment have the same structures, are produced by the same methods, and have the same functions, as those in the first embodiment unless otherwise specified.

In FIG. 4, the component built-in module includes an electric insulation layer 401, wiring patterns (first wiring patterns) 402*a* and 402*b*, semiconductors 403 as electronic components, inner vias (first inner vias) 404 made of a via paste, and circuit components 406 as electronic components.

In the present embodiment, the circuit components 406 are embedded in the electric insulation layer 401. By embedding the circuit components 406, it is possible to improve the function of the component built-in module. Further, it also is possible to shorten the wiring length, and hence, it is suitable for high frequencies.

Components such as chip components like an LCR, a SAW filter, a balun, etc. can be used as the circuit components 406. For connecting the wiring patterns 402*a* and 402*b* with the circuit components 406, a solder 407 or a conductive adhesive can be used. Furthermore, the electric insulation layer 401 serves to protect the circuit components 406 from the external atmosphere, thereby preventing the degradation of reliability due to moisture. Moreover, in the case where a mixture of a filler and an insulating resin is used as a material for forming the electric insulating layer 401, the sintering step at a high temperature is unnecessary, unlike the case of a ceramic substrate. This makes it possible to embed discrete circuit components 406 therein.

Furthermore, the semiconductors 403 and the circuit components 406 embedded in the electric insulation layer 401 are disposed so as to face each other in the direction in which the wiring patterns 402*a* and 402*b* are laminated (thickness direction). This configuration allows an increase in the number of components to be built in, thereby enabling higher-density component-mounting.

Furthermore, the semiconductors 403 and the circuit components 406 are mounted on the wiring patterns 402 that are exposed on external surfaces. The semiconductors 403 are mounted thereon with bumps 405 being provided therebetween. The circuit components 406 are mounted with the solder 407. Alternatively, a conductive adhesive is usable for mounting the semiconductors 403 and the circuit components 406. By providing electric connection by means of the inner vias 404 made of a via paste, the semiconductors 403 and the circuit components 406 can be mounted throughout an entirety of external surfaces at a high density.

In the present embodiment, the height of the inner vias 404 in the lamination direction of the wiring patterns 402*a* and 402*b* (the vertical direction as viewed in FIG. 4) is smaller than a distance from surfaces of the wiring patterns 402*a* on which the semiconductor 403 or the circuit component 406 in the electric insulation layer 401 are mounted to an upper surface of the foregoing semiconductor 403 or the foregoing circuit component 406 (more preferably, the thickness of the foregoing semiconductor 403 or the foregoing circuit component 406). It is preferable in particular that the semiconductor 403 or the circuit component in the electric insulation layer 401, and the inner via 404 that exists in a range overlapping the range in which the semiconductor 403 or the circuit component 406 exists (i.e., the inner via 404 that is provided to face the semiconductor 403 or the circuit component 406 in the horizontal direction as viewed in FIG. 1) in the foregoing direction satisfy the foregoing requirement of relationship as to height. The wiring patterns 402*a* that face each other in the lamination direction are connected not directly by means of one inner via, but by means of a plurality of inner vias 404 with the inner wiring patterns 402*b* being interposed therebetween, whereby the foregoing relationship as to the height can be satisfied. Thus, by electrically connecting the inner wiring patterns 402*b* and the wiring patterns 402*a*, or the inner wiring patterns 402*b* in different layers with each other, by means of the inner vias 404, a ratio of a height of each inner via 404 to a diameter of the same can be decreased. In the present embodiment, since two layers of the inner wiring patterns 402*b* are provided, the foregoing ratio of the height of the inner via 404 to the diameter thereof is approximately ⅓ of that in the case where the inner wiring patterns 402*b* are not provided. Consequently, connection with high reliability is ensured, while the via diameter is decreased, thereby making it possible to provide a component built-in module suitable for incorporating a semiconductor.

It should be noted that the present embodiment is described by taking as an example a case where semiconductors and circuit components are mounted on only the wiring patterns 402*a* that are exposed on a surface on one side, but they may be mounted on the wiring patterns 402*a* on both sides.

Fifth Embodiment

Figure 5:
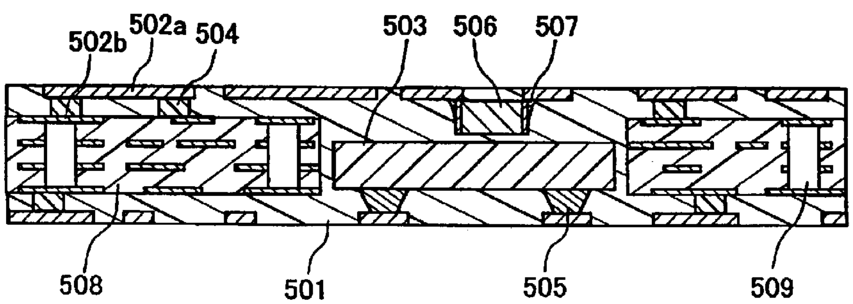
FIG. 5 is a cross-sectional view illustrating a component built-in module according to a fifth embodiment of the present invention.

A fifth embodiment is still another example of a component built-in module. FIG. 5 is a cross-sectional view illustrating a component built-in module according the present embodiment. The members shown in the drawing that are referred to with the same names as those in the first embodiment have the same structures, are produced by the same methods, and have the same functions, as those in the first embodiment unless otherwise specified.

In FIG. 5, the component built-in module includes an electric insulation layer 501, wiring patterns (first wiring patterns) 502*a*, a semiconductor 503 as an electronic component, inner vias (first inner vias) 504 made of a via paste, a circuit component 506 as an electronic component, and a wiring board 508. The semiconductor 503 and the circuit component 506 are connected via bumps 505 and via solder 507, respectively, with the wiring patterns 502*a*.

In the present embodiment, the wiring board 508 is covered with an electric insulation layer 501. As the wiring board 508, a glass-epoxy substrate, a ceramic substrate, or a multi-layer substrate having inner via connection (for instance, a built-up board, "ALIVH" (trademark of Matsushita Electric Industrial Co., Ltd.)) can be used. The wiring board 508 includes wiring patterns (second wiring patterns) 502*b* in at least two layers, and through holes 509 that connect the second wiring patterns 502*b* in different layers with each other. By utilizing the wiring board 508 provided with the through holes 509, it is possible to utilize existing reliable electric connection, thereby providing a component built-in module suitable for incorporating a semiconductor. Furthermore, a generally used wiring board can be used. By connecting the first wiring pattern 502*a* with the second wiring pattern 502*a*on a top surface layer of the wiring board 508 by means of the inner via 504 over the electric insulation layer 501, a semiconductor and a circuit component can be mounted on surfaces of the wiring patterns 502*a* (see the fourth embodiment). As a result, a component built-in module suitable for high densification can be provided.

It should be noted that, though the present embodiment is described by taking as an example a case where both of the surfaces of the wiring board are covered with the electric insulation layer 501, only one of the surfaces thereof may be covered.

Furthermore, though the present embodiment is described by taking as an example a case where the wiring board 508 provided with through holes 509 is incorporated, a wiring board provided with inner vias (second inner vias) may be used instead.

Sixth Embodiment

A sixth embodiment is an example of a method for producing the component built-in module shown in FIG. 5. FIGS. 6A to 6E are cross-sectional views illustrating the process for manufacturing a component built-in module stepwise according to the sixth embodiment. The members shown in the drawing that are referred to with the same names as those in the first through fifth embodiments have the same structures, are produced by the same methods, and have the same functions, as those in the first through fifth embodiments unless otherwise specified.

Figure 6A:
FIGS. 6A to 6E are cross-sectional views illustrating a process for manufacturing a component built-in module stepwise according to a sixth embodiment.
Figure 6B:
Figure 6C:
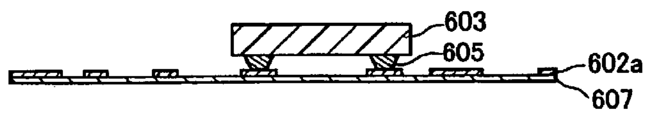

The steps shown in FIGS. 6A, 6B, and 6C are the same as those shown in FIGS. 2A, 2B, and 2E, respectively. As shown in FIG. 6A, vias 606 are formed in an electric insulation layer 601, and a via paste 604 is filled in the vias 606, as shown in FIG. 6B. Here, the electric insulation layer 601 is in a non-cured state. In parallel with this, a semiconductor 603 is mounted on wiring patterns (first wiring patterns) 602*a* formed on a carrier 607 with bumps 605 being provided therebetween, as shown in FIG. 6C.

Figure 6D:
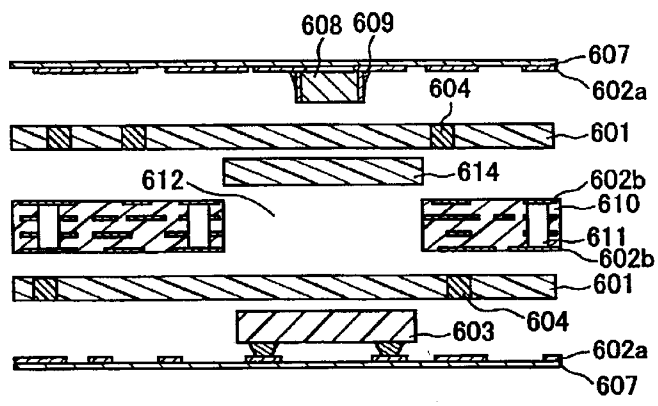

Furthermore, apart from this, the following are prepared, as shown in FIG. 6D: a carrier 607 provided with wiring patterns (first wiring patterns) 602*a* on which a circuit component 608 is mounted using a cream-type solder 609; a wiring board 610 that includes wiring patterns (second wiring patterns) 602*b* in a plurality of layers, through holes 611 for connecting them, and a hole 612 for incorporating the semiconductor 603 and the circuit component 608; and an electric insulation material 614 in a non-cured state for filling the hole 612 in the wiring board 610. As the electric insulation material 614, the same material that is used for the electric insulation layer 601 can be used. Then, as shown in FIG. 6D, the carrier 607 provided with the wiring patterns 602*a* on which the circuit component 608 is mounted, the electric insulation layer 601 as shown in FIG. 6B, the electric insulation material 614, the electric insulation layer 601 as shown in FIG. 6B, and the carrier 607 provided with the wiring patterns 602*a* on which the semiconductor 603 is mounted as shown in FIG. 6C are aligned and laminated in the stated order from above. By pressing and heating, these members are integrated and cured. At the same time, the first wiring patterns 602*a* and the second wiring patterns 602*b* are connected electrically through the via paste 604. Here, the thickness of the electric insulation layer 601 on the upper side among the two electric insulation layers 601 shown in FIG. 6D is smaller than the height of the circuit component 608. Furthermore, the thickness of the other electric insulation layer 601 on the lower side in FIG. 6D is smaller than the height of the semiconductor 603.

Figure 6E:
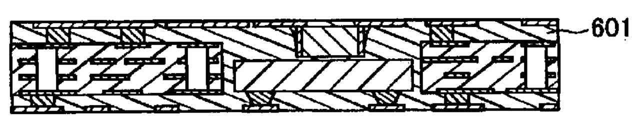

Thereafter, the carriers 607 on both of the surfaces are removed, whereby a component built-in module shown in FIG. 6E is obtained. This allows semiconductors and circuit components to be mounted on the wiring patterns 602*a* exposed to the external surfaces (see the fourth embodiment), thereby providing a component built-in module suitable for high densification. Furthermore, a component built-in module is provided by utilizing the through holes 611, which are highly reliable.

Seventh Embodiment

A seventh embodiment is an example of a method for producing the component built-in module. FIGS. 7A to 7G are cross-sectional views illustrating the process for manufacturing a component built-in module stepwise according to the seventh embodiment. The members shown in the drawing that are referred to with the same names as those in the first through sixth embodiments have the same structures, are produced by the same methods, and have the same functions, as those in the first through sixth embodiments unless otherwise specified.

Figure 7A:
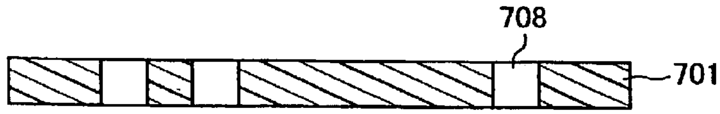
FIGS. 7A to 7G are cross-sectional views illustrating a process for manufacturing a component built-in module stepwise according to a seventh embodiment.

First of all, an electric insulation layer 701 is prepared, as shown in FIG. 7A. An example of a method for producing the electric insulation layer 701 is described as follows. A component built-in module takes a board form, and the electric insulation layer 701 may be made of an insulating resin, a mixture of a filler and an insulating resin, or the like. It may contain a reinforcing material such as a glass cloth or an unwoven fabric. The electric insulation layer 701 normally may have a thickness of not more than 500 $\mu$m per one layer, and a 200 $\mu$m thick sheet is used in the present embodiment. Next, vias 708 are formed in the plate-like electric insulation layer 701. Not more than 1 mm is appropriate as a diameter of the vias 708, and it is necessary to select the diameter according to the thickness of the electric insulation layer 701. In the present embodiment, the diameter is set to 200 $\mu$m.

Figure 7B:

Next, as shown in FIG. 7B, a via paste 704 is filled in the vias 708.

Figure 7C:
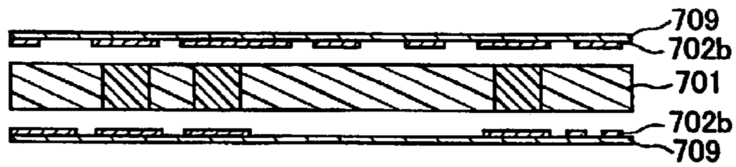

Next, as shown in FIG. 7C, wiring patterns 702*b* are formed on carriers 709. On both surfaces of the electric insulation layer 701 in the state shown in FIG. 7B, the carriers 709 provided with the wiring patterns 702*b* are aligned and laminated.

Figure 7D:
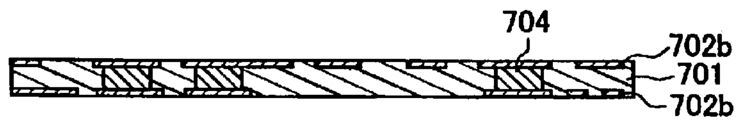

As shown in FIG. 7D, the carriers 709 are removed after pressing, so that the electric insulation layer 701 provided with the wiring patterns 702*b* on both of its surfaces is obtained. Through this process, the wiring patterns 702*b* are transferred onto the electric insulation layer 701, and the wiring patterns 702*b* on both sides are connected electrically through the via paste 704. By laminating the wiring patterns 702*b* on both of the opposed surfaces of the via paste 704, it is possible to handle the electric insulation layer 701 in a state in which the via paste 704 is not exposed. The transferring of the wiring patterns 702*b* is carried out under a condition in which the curing of the electric insulation layer 701 is not completed. The condition in which the curing is not completed means at a temperature not lower than the temperature at which the insulating resin is cured and a period of time not longer than that required for curing (180° C.×5 min), or at a temperature not higher than the curing temperature. By forming the wiring patterns 702*b*, a ratio of a height of the via paste 704 to a diameter thereof can be decreased, thereby improving reliability and reducing the diameter of the via.

In parallel with the foregoing process, two members are prepared by providing wiring patterns 702*a* on a carrier 709 for each member. Then, a semiconductor 703 and a circuit component 706 are provided on the wiring patterns 702*a* on the two members, respectively. As a method for mounting the circuit component 706, a soldering technique of printing a cream-type solder 707 on the wiring patterns 702*a* and heating the same can be used. Alternatively, a conductive adhesive may be used. Usable as a method for mounting the semiconductor 703, are flip chip bonding utilizing ACF, NCF, a non-conductive particle paste (NCP), gold-gold junction, or stud bumps, and soldering of a real-chip-size-package (R-CSP). In the present embodiment, stud bumps 705 are used. It should be noted that a sealing resin 710 may be injected between the semiconductor 703 and the wiring pattern 702*a*. By injecting the sealing resin 710, it is possible to prevent a gap from being formed between the semiconductor 703 and the wiring patterns 702*a* when the semiconductor 703 is embedded in the electric insulation layer 701 in a later step. An underfill resin used for ordinary flip chip bonding can be used as the sealing resin 710. An effect of preventing the semiconductor 703 from being damaged and improving the reliability can be expected with the use of the sealing resin 710. By mounting the semiconductor 703 and the circuit component 706 on the wiring pattern 702*a* on different members, respectively, it is possible to apply different mounting processes (for instance, the soldering and the flip chip bonding). Furthermore, in the case where an R-CSP is used as the semiconductor 703, the same mounting process is applied for mounting the semiconductor 703 and the circuit component 706, thereby facilitating the mounting of the same onto the same wiring patterns 702*a*.

Figure 7E:
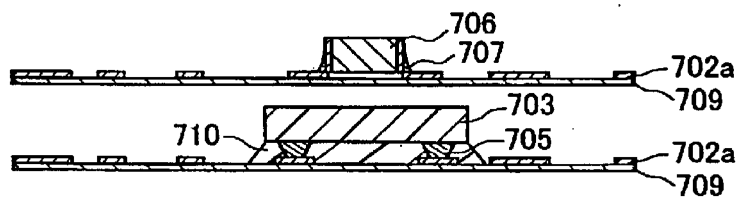
Figure 7F:
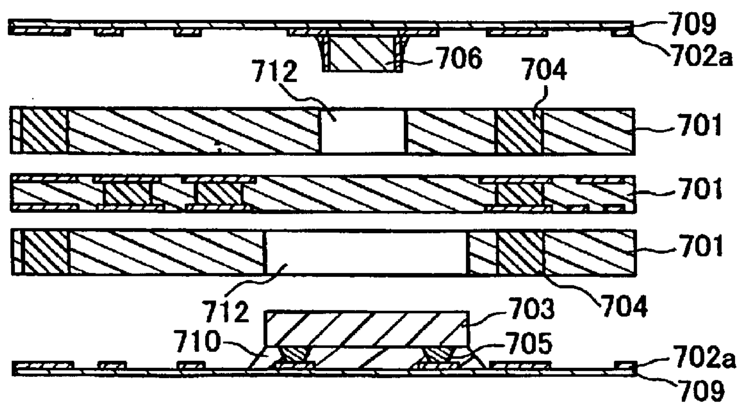
Figure 7G:
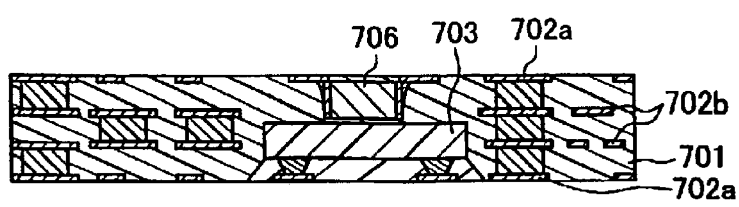

Thereafter, two electric insulation layers 701 filled with the via paste 704 are produced in the same manner through the steps shown in FIGS. 7A and 7B. In the electric insulation layers 701, holes 712 are formed for incorporating the circuit component 706 and the semiconductor 703, respectively. Then, as shown in FIG. 7F, the carrier 709 provided with the wiring patterns 702*a* on which the circuit component 706 is mounted as shown in FIG. 7E, the electric insulation layer 701 having the hole 712, the electric insulation layer 701 having the wiring patterns 702*b* on both surfaces thereof as shown in FIG. 7D, the electric insulation layer 701 having the hole 712, and the carrier 709 provided with the wiring patterns 702*a* on which the semiconductor 703 is mounted as shown in FIG. 7E, are aligned and laminated in the stated order from above. Here, the thickness of the electric insulation layer 701 at the top among the three electric insulation layers 701 shown in FIG. 7F is smaller than the height of the circuit component 706. Furthermore, the thickness of the electric insulation layer 701 at the bottom in FIG. 7F is smaller than the height of the semiconductor 703.

By pressing and heating, the semiconductor 703 and the circuit component 706 are embedded in the electric insulation layers 701, and the electric insulation layers 701 are integrated. Unlike the method according to the sixth embodiment in which the hole 612 is provided in the wiring board 610 so as to incorporate the semiconductor and the circuit component therein, the semiconductor and the circuit component to be embedded can be disposed at any desired positions. By heating after pressing, the electric insulation layers 701 are cured. After curing, the carriers 709 are removed, thereby providing a component built-in module that has the wiring patterns 702*a* on surfaces thereof, that contains the inner wiring patterns 702*b*, the semiconductor 703, and the circuit component 706, and that has a decreased aspect ratio of the inner via (via paste) 704 because of the wiring patterns 702*a*.

Thereafter, other semiconductors and circuit components are mounted on the wiring patterns 702*a* on the surfaces, whereby a component built-in module shown in FIG. 4 is obtained.

Eighth Embodiment

Figure 8:
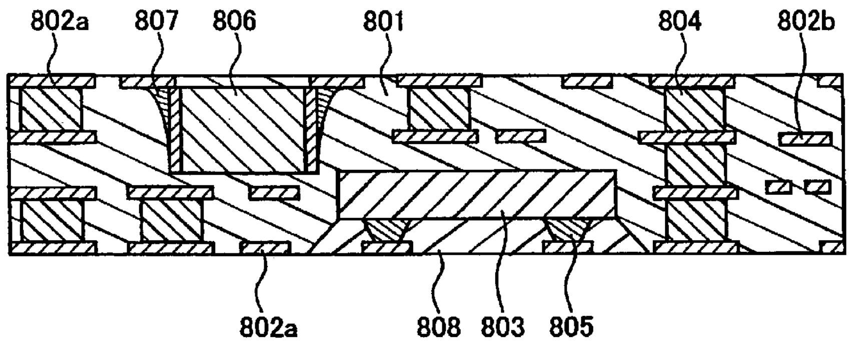
FIG. 8 is a cross-sectional view illustrating a component built-in module according to an eighth embodiment of the present invention.

An eighth embodiment is still another example of a component built-in module. FIG. 8 is a cross-sectional view illustrating a component built-in module according the present embodiment. The members shown in the drawing that are referred to with the same names as those in the first through seventh embodiments have the same structures, are produced by the same methods, and have the same functions, as those in the first through seventh embodiments unless otherwise specified.

In FIG. 8, the component built-in module includes an electric insulation layer 801, wiring patterns 802*a* and 802*b*, a semiconductor 803 as an electronic component, inner vias 804 made of a via paste, and a circuit component 806 as an electronic component. The semiconductor 803 and the circuit component 806 are connected via bumps 805 and via solder 807, respectively, with the wiring patterns 802*a*. Junction portions between the semiconductor 803 and the wiring patterns 802*a* are protected with a sealing resin 808.

In the present embodiment, the semiconductor 803 and the circuit component 806 are embedded in the electric insulation layer 801. An electric insulation layer in contact with the semiconductor 803 and the circuit component 806, and an electric insulation layer in contact with the inner vias 804 are formed integrally. By thus providing the same integrally, the semiconductor 803, the circuit component 806, and the inner wiring patterns 802*b* can be disposed at any desired positions in the electric insulation layers 801. Here, in the case where the inner wiring patterns 802*b* are limited to land patterns, regions allowed to contain the semiconductor 803 and the circuit component 806 are maximized, whereby a higher-density component built-in module can be provided. Here, the "land patterns" refers to wiring patterns that are connected with only the inner vias 804 positioned on upper or lower sides of the same, and that are insulated in the horizontal directions.

Ninth Embodiment

Figure 9:
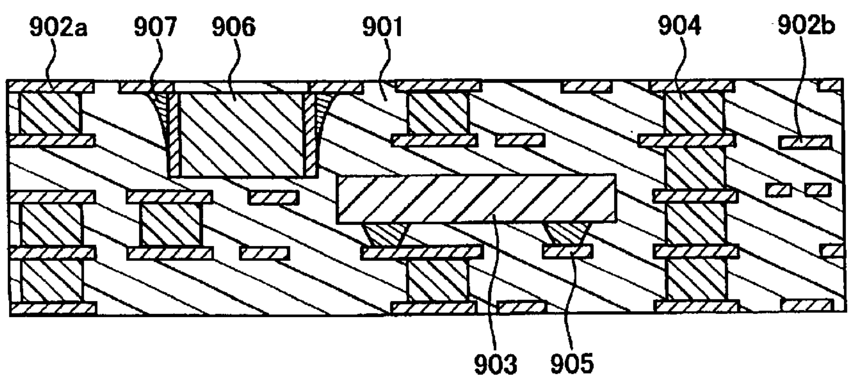
FIG. 9 is a cross-sectional view illustrating a component built-in module according to a ninth embodiment of the present invention.

A ninth embodiment is still another example of a component built-in module. FIG. 9 is a cross-sectional view illustrating a component built-in module according the present embodiment. The members shown in the drawing that are referred to with the same names as those in the first through eighth embodiments have the same structures, are produced by the same methods, and have the same functions, as those in the first through eighth embodiments unless otherwise specified.

In FIG. 9, the component built-in module includes an electric insulation layer 901, wiring patterns 902*a* and 902*b*, a semiconductor 903 as an electronic component, inner vias 904, and a circuit component 906 as an electronic component. The semiconductor 903 is connected via bumps 905 with the inner wiring patterns 902*b*, and the circuit component 906 is connected via solder 907 with the wiring patterns 902*a*.

In the present embodiment, the wiring patterns on which the semiconductor 903 is mounted are the inner wiring patterns 902*b* formed inside the electric insulation layer 901. It also is possible to mount the circuit component 906 on the inner wiring patterns 906*b*. By mounting the electronic components such as the semiconductor 903 and the circuit component 906 on the inner wiring patterns 902*b*, a circuitry with the shortest wirings is provided, and this allows the module to be formed in a smaller size.

To mount an electronic component on the inner wiring patterns 902*b* as in the present embodiment, for instance, in the producing method of the second embodiment (FIGS. 2A to 2G), the electric insulation layer 201 shown in FIG. 2B and the carrier 207 provided with the wiring patterns as shown in FIG. 2C may be laminated on a lower surface of the component built-in module as shown in FIG. 2G.

Alternatively, an electric insulation layer having wiring patterns on both surfaces thereof that are connected inner vias and having an electronic component mounted on the wiring patterns on one of the surfaces may be used in place of an electronic component-mounted matter shown in FIG. 2E, and subjected to the same process as that according to the second embodiment. Further alternatively, the foregoing electric insulation layer may be used in place of an electronic component-mounted matter shown in FIG. 3C, and subjected to the same process as that according to the third embodiment.

Tenth Embodiment

Figure 10:
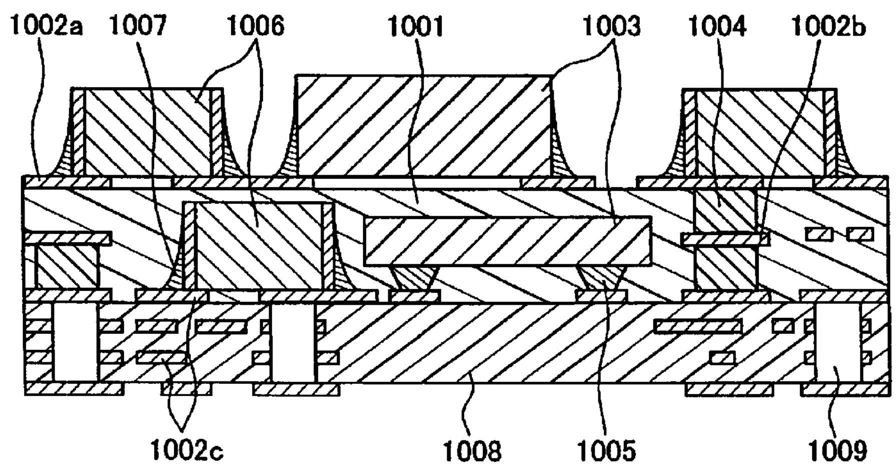
FIG. 10 is a cross-sectional view illustrating a component built-in module according to a tenth embodiment of the present invention.

A tenth embodiment is still another example of a component built-in module. FIG. 10 is a cross-sectional view illustrating a component built-in module according the present embodiment. The members shown in the drawing that are referred to with the same names as those in the first through ninth embodiments have the same structures, are produced by the same methods, and have the same functions, as those in the first through ninth embodiments unless otherwise specified.

In FIG. 10, the component built-in module includes an electric insulation layer 1001, wiring patterns (first wiring patterns) 1002*a* and 1002*b*, a semiconductor 1003 as an electronic component, inner vias (first inner vias) 1004, a circuit component 1006 as an electronic component, and a wiring board 1008. The wiring board 1008 includes wiring patterns (second wiring patterns) 1002*c* in at least two layers, and through holes 1009 that connect the second wiring patterns 1002*c* in different layers with each other. The semiconductor 1003 and the circuit component 1006 are connected via bumps 1005 and via solder 1007, respectively, with the wiring patterns 1002*c* on surfaces of the wiring board 1008.

In the present embodiment, the wiring patterns 1002*c* on which the semiconductor 1003 and the circuit component 1006 are mounted are the inner wiring patterns 1002*c* formed on the wiring board 1008. An existing module structure obtained by mounting electronic components such as the semiconductor 1003 and the circuit component 1006 on external surfaces of the wiring board 1008 is used. Then, the semiconductor 1003 and the circuit component 1006 are embedded in the electric insulation layer 1001, so that other electronic components such as semiconductors 1003 and circuit components 1006 may be mounted on the wiring patterns 1002*a* formed on surfaces of the electric insulation layer 1001. By doing so, it is possible to mount components on a module at a higher density.

The component built-in module according to the present embodiment can be produced by using the wiring board 1008 having electronic components mounted on the wiring patterns 1002*c* on its surfaces in place of the component-mounted matter shown in FIG. 2E and subjecting the same to the same process as that according to the second embodiment, or alternatively, by using the same in place of the component-mounted matter shown in FIG. 3C and subjecting the same to the same process as that according to the third embodiment.

EXAMPLES

The following description will depict specific examples of the present invention.

Example 1

The following description will depict an example of the results of an experiment as to the dependency of the reliability of a component built-in module of the present invention on the aspect ratio of an inner via (the ratio of the height of a via to the diameter thereof).

In the present example, component built-in modules were produced so as to have via diameters, via heights, and the numbers of inner wiring pattern layers shown in Table 1 below.

In the example, a sheet-form electric insulation layer made of silica and an epoxy resin as a filler and an insulating resin, respectively, was used. The electric insulation layer had a thickness of 800 μm in the case where the number of the inner wiring pattern layer=0, or 400 μm in the case where the number of the inner wiring pattern layer=1, so that in both cases, the total thickness was 800 μm.

First of all, a plurality of vias were formed in the electric insulation layer in a non-cured state (B-stage) using a puncher. The via diameters were as shown in Table 1. After forming the vias, a via paste (a mixture composition of silver particles, epoxy-phenol resin, and a curing agent) was filled in the vias.

In parallel with the foregoing process, wiring patterns were formed by exposing, developing, and etching a copper foil formed on a carrier (film). A semiconductor bare chip (thickness: 500 μm) was mounted on the wiring patterns using solder bumps.

After mounting the semiconductor, the wiring patterns (on which the semiconductor had been mounted), the electric insulation layer, and wiring patterns (on which no semiconductor had been mounted) were aligned and laminated, and the electric insulation layer was cured by pressing at a pressure of 6 MN while heating the same at 170° C. for one hour. At the same time, the via paste was cured, so that electric connection between the wiring patterns (between wiring patterns and inner wiring patterns in the case where inner wiring patterns are provided) was achieved. In the case of samples provided with inner wiring patterns, an electric insulation layer provided with wiring patterns on both surfaces thereof was interposed between the foregoing electric insulation layer and the wiring patterns upon lamination.

After curing the electric insulation layer, the carrier was removed, whereby a component built-in module was obtained.

To evaluate the reliability of the component built-in modules produced according to the present example, a solder reflowing test was carried out. In the solder reflowing test, a belt-type reflowing tester was used, and a cycle composed of a step of maintaining a sample at the highest temperature of 260° C. for 10 seconds and a step of cooling the same to normal temperature was repeated ten times. Resistances of each inner via were measured before and after the solder reflowing test, and inner vias whose resistances changed 50% or more with respect to the resistances before the test were determined as "defective". Ratios of such defective inner vias are shown in Table 1 as defective via ratios.

TABLE 1

| Sample No. | 1 | 2 | 3 | 4 | 5 | 6 | 7 | 8 |
|---|---|---|---|---|---|---|---|---|
| Via Diameter (μm) | 100 | 100 | 200 | 200 | 400 | 400 | 800 | 800 |
| Via Height (μm) | 800 | 400 | 800 | 400 | 800 | 400 | 800 | 400 |
| Number of Inner Wiring Pattern Layers | 0 | 1 | 0 | 1 | 0 | 1 | 0 | 1 |
| Defective Via Ratio (%) | 88 | 24 | 62 | 3.1 | 3.7 | 0.1 | 0.2 | 0.0 |

As shown in Table 1, it was found that the ratio of a via height to a via diameter influences the reliability of a component built-in module, and that the use of inner wiring pattern layers allows high reliability to be obtained even with the same via diameter.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A method for manufacturing a component built-in module, comprising the steps of:

forming a first inner via in an electric insulation layer;

mounting an electronic component on a first wiring pattern; and laminating the electric insulation layer and another wiring pattern different from said first wiring pattern in this order on a surface of the first wiring pattern on which the electronic component is mounted so theat said first wiring pattern and the another wiring pattern, which are provided opposite each other with the electric insulation layer being interposed therebetween, are electrically connected through the first inner via, wherein the electric insulation layer before being laminated has a thickness smaller than a height of the electronic component in a direction of the lamination.

2. The method according to claim 1, wherein:

the another wiring pattern is provided on a surface of another electric insulation layer different from said electric insulation layer; and the another wiring pattern is connected with an inner via formed in the another electric insulation layer.

3. The method according to claim 2, wherein the another electric insulation layer has a wiring pattern on the other surface thereof, and the wiring pattern on the other surface is connected with the inner via of the another electric insulation layer.

4. The method according to claim 1, wherein the another wiring pattern is carried on a carrier, the method further comprising a step of removing the carrier that is carried out after the laminating step.

5. The method according to claim 1, wherein the another wiring pattern is a second wiring pattern exposed on a surface of a wiring board, the wiring board including:

second wiring patterns in at least two layers, including said second wiring pattern; and a through hole and/or a second inner via that electrically connects the second wiring patterns in different layers with each other.

6. The method according to claim 1, wherein the electric insulation layer before being laminated has a hole for accepting the electronic component.

7. The method according to claim 1, wherein at least a part of the electronic component is embedded in the electric insulation layer upon making the electric connection.

8. The method according to claim 1, wherein the electric insulation layer is cured upon the electric connection.

9. The method according to claim 1, wherein at least a part of the electronic component is embedded in the electric insulation layer and the electric insulation layer is cured upon the electric connection.

10. The method according to claim 1, wherein the electric insulation layer before being laminated is in a non-cured state.

11. A method for manufacturing a component built-in module, comprising the steps of:

forming a first inner via in an electric insulation layer;

preparing a wiring board including second wiring patterns in at least two layers, and a through hole and/or a second inner via that electrically connects the second wiring patterns in different layers with each other;

mounting an electronic component on the second wiring pattern that is exposed on a surface of the wiring board; and laminating the electric insulation layer and a first wiring pattern in this order on the second wiring pattern on which the electronic component is mounted so that the second wiring pattern and the first wiring pattern, which are provided opposite each other with the electric insulation layer being interposed therebetween, are electrically connected through the first inner via, wherein the electric insulation layer before being laminated has a thickness smaller than a height of the electronic component in a direction of the lamination.

12. The method according to claim 11, wherein:

the first wiring pattern is provided on a surface of another electric insulation layer different from said electric insulation layer; and the first wiring pattern is connected with an inner via formed in the another electric insulation layer.

13. The method according to claim 12, wherein the another electric insulation layer has a wiring pattern on the other surface thereof, and the wiring pattern on the other surface is connected with the inner via of the another electric insulation layer.

14. The method according to claim 11, wherein the first wiring pattern is carried on a carrier, the method further comprising a step of removing the carrier that is carried out after the laminating step.

15. The method according to claim 11, wherein the electric insulation layer before being laminated has a hole for accepting the electronic component.

16. The method according to claim 11, wherein at least a part of the electronic component is embedded in the electric insulation layer upon making the electric connection.

17. The method according to claim 11, wherein the electric insulation layer is cured upon the electric connection.

18. The method according to claim 11, wherein at least a part of the electronic component is embedded in the electric insulation layer and the electric insulation layer is cured upon the electric connection.

19. The method according to claim 11, wherein the electric insulation layer before being laminated is in a non-cured state.

* * * * *